(12) United States Patent
Tuominen et al.

(10) Patent No.: US 8,222,723 B2
(45) Date of Patent: Jul. 17, 2012

(54) ELECTRIC MODULE HAVING A CONDUCTIVE PATTERN LAYER

(75) Inventors: Risto Tuominen, Espoo (FI); Petteri Palm, Helsinki (FI)

(73) Assignee: Imbera Electronics Oy, Espoo (FI)

( * ) Notice: Subject to any disclaimer, the term of this patent is extended or adjusted under 35 U.S.C. 154(b) by 186 days.

(21) Appl. No.: 12/699,628

(22) Filed: Feb. 3, 2010

(65) Prior Publication Data

US 2010/0202114 A1    Aug. 12, 2010

Related U.S. Application Data

(63) Continuation-in-part of application No. 10/550,023, filed as application No. PCT/FI2004/000195 on Mar. 31, 2004, now Pat. No. 7,663,215.

(30) Foreign Application Priority Data

Apr. 1, 2003   (FI) ...................................... 20030493

(51) Int. Cl.
  *H01L 23/02* (2006.01)
  *H01L 23/48* (2006.01)
  *H01L 21/00* (2006.01)
  *H01K 3/10* (2006.01)
  *H05K 3/34* (2006.01)

(52) U.S. Cl. ......... 257/686; 257/E23.085; 257/E23.178; 257/E25.011; 257/E23.105; 257/E21.705; 257/777; 257/723; 257/778; 257/692; 257/773; 257/774

(58) Field of Classification Search .................. 257/686, 257/E23.085, E23.178, E25.011, E23.105, 257/E21.705, 777, 723, 778, 692, 773, 774
See application file for complete search history.

(56) References Cited

U.S. PATENT DOCUMENTS

| | | | |
|---|---|---|---|
| 4,246,595 | A | 1/1981 | Noyori et al. |
| 4,746,392 | A | 5/1988 | Hoppe |
| 5,248,852 | A | 9/1993 | Kumagai |
| 5,306,670 | A | 4/1994 | Mowatt et al. |
| 5,353,195 | A | 10/1994 | Fillion et al. |
| 5,355,102 | A | 10/1994 | Kornrumpf et al. |
| 5,497,033 | A | 3/1996 | Fillion et al. |
| 5,552,633 | A | 9/1996 | Sharma |
| 6,038,133 | A | 3/2000 | Nakatani et al. |
| 6,154,366 | A | 11/2000 | Ma et al. |
| 6,271,469 | B1 | 8/2001 | Ma et al. |
| 6,284,564 | B1 | 9/2001 | Balch et al. |
| 6,396,148 | B1 | 5/2002 | Eichelberger et al. |
| 6,475,877 | B1 | 11/2002 | Saia et al. |
| 6,701,614 | B2 | 3/2004 | Ding et al. |

(Continued)

FOREIGN PATENT DOCUMENTS

JP    2001-053447 A    2/2001

(Continued)

*Primary Examiner* — A O Williams (74) *Attorney, Agent, or Firm* — Birch, Stewart, Kolasch & Birch, LLP (57) ABSTRACT

An electronic module including a conductive-pattern layer; an insulating-material layer supporting the conductive-pattern layer; and at least one component inside the insulating-material layer is disclosed. The component includes a first surface and contact zones on the first surface. The electronic module further includes a first hardened adhesive layer on the first surface of the component; a second hardened adhesive layer in contact with the conductive-pattern layer and the first hardened adhesive layer; holes in the first and second hardened adhesive layer at the locations of the contact zones; and conductive material in the holes and in electrical connection with the contact zones of the component and the conductive-pattern layer.

9 Claims, 8 Drawing Sheets

U.S. PATENT DOCUMENTS

| | | |
|---|---|---|
| 6,713,859 B1 | 3/2004 | Ma |
| 6,783,077 B1 | 8/2004 | Fannasch |
| 6,876,072 B1 | 4/2005 | Wang et al. |
| 7,294,529 B2 * | 11/2007 | Tuominen .................. 438/107 |
| 7,609,527 B2 * | 10/2009 | Tuominen et al. ........... 361/761 |
| 2002/0117743 A1 | 8/2002 | Nakatani et al. |
| 2003/0068852 A1 | 4/2003 | Towle et al. |
| 2003/0159852 A1 | 8/2003 | Nakamura |

FOREIGN PATENT DOCUMENTS

| | | |
|---|---|---|
| WO | WO 03/065778 A1 | 8/2003 |

* cited by examiner

ELECTRIC MODULE HAVING A CONDUCTIVE PATTERN LAYER

CROSS REFERENCE TO RELATED APPLICATIONS

This application is a Continuation-In-Part of co-pending U.S. application Ser. No. 10/550,023 filed on Sep. 23, 2005, which is the National Stage application of PCT International Application No. PCT/FI2004/000195 filed on Mar. 31, 2004, which claims the benefit of and to Patent Application No. 20030493 filed in Finland, on Apr. 1, 2003. The entire contents of all of the above applications is hereby incorporated by reference.

BACKGROUND

The present invention relates to an electronic modules.

In particular, the invention relates to an electronic module, which includes one or more components embedded in an installation base. The electronic module can be a module like a circuit board, which includes several components, which are connected to each other electrically, through conducting structures manufactured in the module. The components can be passive components, microcircuits, semiconductor components, or other similar components. Components that are typically connected to a circuit board form one group of components. Another important group of components are components that are typically packaged for connection to a circuit board. The electronic modules to which the invention relates can, of course, also include other types of components.

The installation base can be of a type similar to the bases that are generally used in the electronics industry as installation bases for electrical components. The task of the base is to provide components with a mechanical attachment base and the necessary electrical connections to both components that are on the base and those that are outside the base. The installation base can be a circuit board, in which case the construction and method to which the invention relates are closely related to the manufacturing technology of circuit boards. The installation base may also be some other base, for example, a base used in the packaging of a component or components, or a base for an entire functional module.

The manufacturing techniques used for circuit boards differ from those used for microcircuits in, among other things, the fact that the installation base in microcircuit manufacturing techniques, i.e. the substrate, is of a semiconductor material, whereas the base material of an installation base for circuit boards is some form of insulating material. The manufacturing techniques for microcircuits are also typically considerably more expensive that the manufacturing techniques for circuit boards.

The constructions and manufacturing techniques for the cases and packages of components, and particularly semiconductor components differ from the construction and manufacture of circuit boards, in that component packaging is primarily intended to form a casing around the component, which will protect the component mechanically and facilitate the handling of the component. On the surface of the component, there are connector parts, typically protrusions, which allow the packaged component to be easily set in the correct position on the circuit board and the desired connections to be made to it. In addition, inside the component case, there are conductors, which connect the connector parts outside the case to connection zones on the surface of the actual component, and through which the component can be connected as desired to its surroundings.

However, component cases manufactured using conventional technology demand a considerable amount of space. As electronic devices have grown smaller, there has been a trend to eliminate component cases, which take up space, are not essential, and create unnecessary costs. Various constructions and methods have been developed to solve this problem.

One known solution is flip-chip (FC) technology, in which non-packaged semiconductor components are installed and connected directly to the surface of the circuit board. However, flip-chip technology has many weaknesses and difficulties. For example, the reliability of the connections can be a problem, especially in applications, in which mechanical stresses arise between the circuit board and the semiconductor component. In an attempt to avoid mechanical stresses, a suitable elastic underfill, which equalizes mechanical stresses, is added between the semiconductor component and the circuit board. This procedural stage slows down the manufacturing process and increases costs. Even the thermal expansion caused by the normal operation of a device may cause mechanical stresses large enough to compromise the long-term reliability of an FC structure.

U.S. Pat. No. 4,246,595 discloses one solution, in which recesses are formed in the installation base for the components. The bottoms of the recesses are bordered by a two-layered insulation layer, in which holes are made for the connections of the component. The layer of the insulation layer that lies against the components is made of an adhesive. After this, the components are embedded in the recesses with their connection zones facing the bottom of the recess, electrical contacts being formed to the components through the holes in the insulation layer. If it is wished to make the structure mechanically durable, the component must also be attached to an installation base, so that the method is quite complicated. It is extremely difficult to use a complicated method, which demands several different materials and process stages, to profitably manufacture cheap products. In other ways too, the method does not correspond to the technology used nowadays (the patent dates from 1981).

JP application publication 2001-53 447 discloses a second solution, in which a recess is made for the component in an installation base. The component is placed in the recess, with the component's contact zones facing towards the surface of the installation base. Next, an insulation layer is made on the surface of the installation base and over the component. Contact openings for the component are made in the insulation layer and electrical contacts are made to the component, through the contact openings. In this method, considerable accuracy is demanded in manufacturing the recess and setting the component in the recess, so that the component will be correctly positioned, to ensure the success of the feed-throughs, relative to the width and thickness of the installation board.

SUMMARY

The invention is intended to create a relatively simple and economical method for manufacturing electronic modules, with the aid of which a mechanically durable construction can be achieved.

The invention is based on the component being glued to the surface of a conductive layer, from which conductive layer conductive patterns are later formed. After the gluing of the component, an insulating-material layer, which surrounds the component attached to the conductive layer, is formed on, or attached to the surface of the conductive layer. After the gluing of the component, feed-throughs are also made, through which electrical contacts can be formed between the conductive layer and the conductive zones of the component. After this, conductive patterns are formed from the conductive layer, to which the component is glued.

Considerable advantages are gained with the aid of the invention. This because it is possible, with the aid of the invention, to manufacture mechanically durable electronic modules, which include unpackaged components embedded in an installation base.

The invention permits a quite simple manufacturing method, in which relatively few different materials are required. For this reason, the invention has embodiments, with the aid of which electronic modules can be manufactured at low cost. For example, in the technique disclosed in U.S. Pat. No. 4,246,595, (the references are to FIG. 8 of the patent) a support layer 24, an insulating layer 16, and an adhesion layer 17 are required. In addition, a fourth insulating material (not shown in the embodiment of FIG. 8), i.e. filler with the aid of which the component is attached to the support layer 24, is also required, in order to create a mechanically sturdy attachment. In the solution of the JP application publication 2001-53 447 too, a corresponding attachment that entirely surrounds the component requires about 3-4 separate insulating materials, or insulating layers (publication FIGS. 2 and 4).

Unlike the reference publications, our invention has embodiments, in which the component can be entirely surrounded using 2-3 insulating materials, or insulating layers. This because the contact surface of the component is glued to a conductive layer, so that, in preferred embodiments, the adhesive attaches the component essentially over the entire area of its contact surface. Elsewhere, in such an embodiment, the component is attached with the aid of an insulating-material layer, which acts as the base material for the electronic module being formed. The insulating-material layer is formed after the gluing of the component, so that in preferred embodiments it can be made around the component to conform to the shape of the component. In such embodiments, it is possible to achieve a comprehensive attachment of the component with the aid of an adhesive layer and a base-material layer formed from 1-2 insulating-material sheets.

In the embodiments of the invention, it is thus possible to manufacture a circuit board, inside which components are embedded. The invention also has embodiments, with the aid of which a small and reliable component package can be manufactured around a component, as part of the circuit board. In such an embodiment, the manufacturing process is simpler and cheaper than manufacturing methods in which separate packaged components are installed and connected to the surface of the circuit board. The manufacturing method can also be applied to use the method to manufacture Reel-to-Reel products. Thin and cheap circuit-board products containing components can be made by using the methods according to the preferred embodiments.

The invention also permits many other preferred embodiments, which can be used to obtain significant additional advantages. With the aid of such embodiments, a component's packaging stage, the circuit board's manufacturing stage, and the assembly and connecting stage of the components, for example, can be combined to form a single totality. The combination of the separate process stages brings significant logistical advantages and permits the manufacture of small and reliable electronic modules. A further additional advantage is that such an electronic-module manufacturing method can mostly utilize known circuit-board manufacturing and assembly techniques.

The composite process according to the embodiment referred to above is, as a totality, simpler than manufacturing a circuit board and attaching a component to the circuit board using, for example, the flip-chip technique. By using such preferred embodiments, the following advantages are obtained, compared to other manufacturing methods:

Soldering is not needed in the connections of the components, instead an electrical connection between the connection zones on the surface of the component and the metal film of the installation base is created by a via-method. This means that the connection of a component does not need metal being maintained molten for a long time with its associated high temperature. Thus, the construction is made more reliable than soldered connections. The brittleness of the metal alloys creates large problems particularly in small connections. In a solderless solution according to a preferred embodiment, it is possible to achieve clearly smaller constructions than in soldered solutions.

As smaller structures can be manufactured using the method, the components can be placed closer together. Thus, the conductors between the components also become shorter and the characteristics of the electronic circuits improve. For example, losses, interferences, and transit-time delays can be significantly reduced.

The method permits a lead-free manufacturing process, which is environmentally friendly.

When using a solderless manufacturing process, fewer undesirable intermetallics also arise, thus improving the long-term reliability of the construction.

The method also permits three-dimensional structures to be manufactured, as the installation bases and the components embedded in them can be stacked on top of each other.

The invention also permits other preferred embodiments. For instance, flexible circuit boards can be used in connection with the invention. Further, in embodiments, in which the temperature of the installation base can be kept low during the entire process, organic manufacturing materials can be used comprehensively.

With the aid of embodiments, it is also possible to manufacture extremely thin structures, in which, despite the thinness of the structure, the components are entirely protected inside their installation base, such as a circuit board.

In embodiments, in which the components are located entirely inside the installation base, the connections between the circuit board and the components will be mechanically durable and reliable.

The embodiments also permit the design of electronic-module manufacturing processes requiring relatively few process stages. Embodiments with fewer process stages correspondingly also require fewer process devices and various manufacturing methods. With the aid of such embodiments, it is also possible in many cases to cut manufacturing costs compared to more complicated processes.

The number of conductive-pattern layers of the electronic module can also be chosen according to the embodiment. For example, there can be one or two conductive-pattern layers. Additional conductive-pattern layers can be manufactured on top of these, in the manner known in the circuit-board industry. A total module can thus incorporate, for example, three, four, or five conductive-pattern layers. The very simplest embodiments have only one conductive-pattern layer and indeed one conductor layer. In some embodiments, each of the conductor layers contained in the electronic module can be exploited when forming conductive patterns.

In embodiments, in which the conductor layer connected to a component is patterned only after the connection of the component, the conductor layer can include conductor patterns even at the location of the component. A corresponding advantage can also be achieved in embodiments, in which the electronic module is equipped with a second conductive-pattern layer, which is located on the opposite surface of the base material of the module (on the opposite surface of the insulation material layer relative to the conductive-pattern layer connected to the component). The second conductor layer can thus also include conductive patterns at the location of the component. The placing of conductive patterns in the conductor layers at the location of the component will permit a more efficient use of space in the module and a denser structure.

BRIEF DESCRIPTION OF THE DRAWINGS

In the following, the invention is examined with the aid of examples and with reference to the accompanying drawings.

In the methods of the examples, manufacturing starts from a conductive layer 4, which can be, for example, a metal layer. One suitable manufacturing material for the conductive layer 4 is copper film (Cu). If the conductive film 4 selected for the process is very thin, or the conductive film is not mechanically durable for other reasons, it is recommended that the conductive film 4 be supported with the aid of a support layer 12. This procedure can be used, for example, in such a way that the process is started from the manufacture of the support layer 12. This support layer 12 can be, for example, an electrically conductive material, such as aluminium (Al), steel, or copper, or an insulating material, such as a polymer. An unpatterned conductive layer 4 can be made on the second surface of the support layer 12, for example, by using some manufacturing method well known in the circuit-board industry. The conductive layer can be manufactured, for example, by laminating a copper film (Cu) on the surface of the support layer 12. Alternatively, it is possible to proceed by making the support layer 12 on the surface of the conductive layer 4. The conductive film 4 can also be a surfaced metal film, or some other film including several layers, or several materials. Later in the process, conductive patterns are made from the conductive layer 4. The conductive patterns must then be aligned relative to the components 6. The alignment is most easily performed with the aid of suitable alignment marks, at least some of which can be made already in this stage of the process. Several different methods are available for creating the actual alignment marks. One possible method is to make small through-holes 3 in the conductive layer 4, in the vicinity of the installation areas of the components 6. The same through-holes 3 can also be used to align the components 6 and the insulating-material layer 1. There should preferably be at least two through-holes 3, for the alignment to be carried out accurately.

DETAILED DESCRIPTION

The components 6 are attached to the surface of the conductive layer 4 with the aid of an adhesive. For gluing, an adhesive layer 5 is spread on the attachment surface of the conductive layer 4, or on the attachment surface of the component 6, or on both. Thus, a first layer of adhesive can be formed on the surface of the component 6 and a second layer of adhesive can be formed on the surface of the conductive layer 4. After this, the components 6 can be aligned to the positions planned for the components 6, with the aid of alignment holes 3, or other alignment marks. Alternatively, it is possible to proceed by first gluing the components to the conductive layer 4, positioned relative to each other, and after this making the alignment marks aligned relative to the components. The term attachment surface of the component 6 refers to that surface, which faces the conductive layer 4. The attachment surface of the component 6 includes the contact zones, by means of which an electrical contact can be formed with the component. Thus, the contact zones can be, for example, flat areas on the surface of the component 6, or more usually contact protrusions protruding from the surface of the component 6. There are generally at least two contact zones or protrusions in the component 6. In complex microcircuits, there can be a greater number of contact zones.

In many embodiments, it is preferable to spread so much adhesive on the attachment surface, or attachment surfaces, that the adhesive entirely fills the space remaining between the components 6 and the conductive layer 4. A separate filler is then not required. The filling of the space between the components 6 and the conductive layer 4 reinforces the mechanical connection between the component 6 and the conductive layer 4, thus achieving a structure that is mechanically more durable. The comprehensive and unbroken adhesive layer also supports the conductive patterns 14 to be formed later from the conducting layer 4 and protects the structure during later process stages.

The term adhesive refers to a material, by means of which the components can be attached to the conductive layer. One property of the adhesive is that the adhesive can be spread on the surface of the conductive layer, and/or of the component in a relatively fluid form, or otherwise in a form that will conform to the shape of the surface. Another property of the adhesive is that, after spreading, the adhesive hardens, or can be hardened, at least partly, so that the adhesive will be able to hold the component in place (relative to the conductive layer), at least until the component is secured to the structure in some other manner. A third property of the adhesive is its adhesive ability, i.e. its ability to stick to the surface being glued.

The term gluing refers to the attachment of the component and conductive layer to each other with the aid of an adhesive. Thus, in gluing, an adhesive is brought between the component and the conductive layer and the component is placed in a suitable position relative to the conductive layer, in which the adhesive is in contact with the component and the conductive layer and at least partly fills the space between the component and the conductive layer. After this, the adhesive is allowed (at least partly) to harden, or the adhesive is actively hardened (at least partly), so that the component sticks to the conductive layer with the aid of the adhesive. In some embodiments, the contact protrusions of the component may, during gluing, extend through the adhesive layer to make contact with the conductive layer.

The adhesive used in the embodiments is typically a thermally hardening epoxy, for example an NCA (non-conductive adhesive). The adhesive is selected to ensure that the adhesive used will have sufficient adhesion to the conductive film, the circuit board, and the component. One preferred property of the adhesive is a suitable coefficient of thermal expansion, so that the thermal expansion of the adhesive will not differ too greatly from the thermal expansion of the surrounding material during the process. The adhesive selected should also preferably have a short hardening time, preferably of a few seconds at most. Within this time, the adhesive should harden at least partly, to such an extent that the adhesive is able to hold the component in position. Final hardening can take clearly more time and the final hardening can be planned to take place in connection with later process stages. The adhesive should also withstand the process temperatures used, for example, heating to a temperature in the range 100-265° C. a few times, and other stresses in the manufacturing process, for example, chemical and mechanical stress. The electrical conductivity of the adhesive is preferably in the same order as that of the insulating materials.

In an embodiment using a first layer of adhesive formed on the surface of the component 6 and a second layer of adhesive formed on the surface of the conductive layer 4, the compositions of the adhesive in the first layer and second layer may be different to each other. Of course, it is also possible that the adhesive is the same in both of the adhesive layers.

In an embodiment using two layers of adhesive it is possible to select the first adhesive such that it has a good adhesion to the surface of the component 6 and the second adhesive such that it has a good adhesion to the surface of the conductive layer 4. It is also possible to select the adhesives based on their other properties such as spreading properties, thermal conductivity, thermal expansion coefficient, mechanical strength, price etc. Therefore, using two different layers of adhesive having two different compositions may help in achieving the desired properties of the hardened adhesive between the component and the conductor-layer. It is also possible that one of the adhesives is applied in the form of an adhesive sheet and the other is spread in fluid form. Of course, both of the adhesives can be applied in any suitable form, including adhesive sheet and paste or liquid.

It is also possible that the first and second layers of adhesive are different in size and thickness. For example, the surface area of the second adhesive layer can be greater than the surface area of the first adhesive layer. The second adhesive layer can even extend to the sides of module. Thus, the surface area of the second adhesive layer can be as great as the surface area of the whole module. The first adhesive layer is preferably local and present only at the location of the component. Of course, also the second adhesive layer can be local as well.

A suitable insulating-material layer 1 is selected as the base material of the electronic module, for example, the circuit board. Using a suitable method, recesses, or through-holes are made in the insulating-material layer 1, according to the size and mutual positions of the components 6 to be attached to the conductive layer 4. The recesses or through-holes can also be made to be slightly larger than the components 6, in which case the alignment of the insulating layer 1 relative to the conductive layer 4 will not be so critical. If an insulating-material layer 1, in which through-holes are made for the components 6, is used in the process, certain advantages can be achieved by using, in addition, a separate insulating-material layer 11, in which holes are not made. Such an insulating-material layer 11 can be located on top of the insulating-material layer 1 to cover the through-holes made for the components.

If it is desired to make a second conductive layer in the electronic module, this can be made, for example, on the surface of the insulating-material layer 1. In embodiments, in which a second conductive layer 11 is used, the conductive layer can be made on the surface of this second conductive layer 11. If desired, conductive patterns 19 can be made from a second conductive layer 9. The conductive layer 9 can be made, for example, in a corresponding manner to the conductive film 4. The manufacture of a second conductive film 9 is not, however, necessary in simple embodiments and when manufacturing simple electronic modules. A second conductive film 9 can, however, be exploited in many ways, such as additional space for conductive patterns and to protect the components 6 and the entire module against electromagnetic radiation (EMC shielding). With the aid of a second conductive film 9 the structure can be reinforced and warping of the installation base, for example, can be reduced.

Feed-throughs, through which electrical contacts can be formed between the contact zones of the components 6 and the conductive layer 4, are made in the electronic module. Holes 17 are made in the conductive layer 4 for the feed-throughs, at the positions of the contact zones (in the figures, the contact protrusions 7) of the components 6. Holes 3, or other available alignment marks can be utilized in the alignment. The holes 17 are made in such a way that they also penetrate through the adhesive layer that has been left on top of the contact zones, or contact protrusions 7. The holes 17 thus extend to the material of the contact protrusions 7 or other contact zones. The holes 17 can be made, for example, by drilling with a laser device, or by using some other suitable method. After this, conductive material is introduced to the hole 17, so that an electrical contact is formed between the components 6 and the conductive layer 4.

The manufacturing processes according to the examples can be implemented using manufacturing methods, which are generally known to those versed in the art of manufacturing circuit boards.

In the following, the stages of the method shown in FIGS. 1-8 are examined in greater detail.

Figure 1:
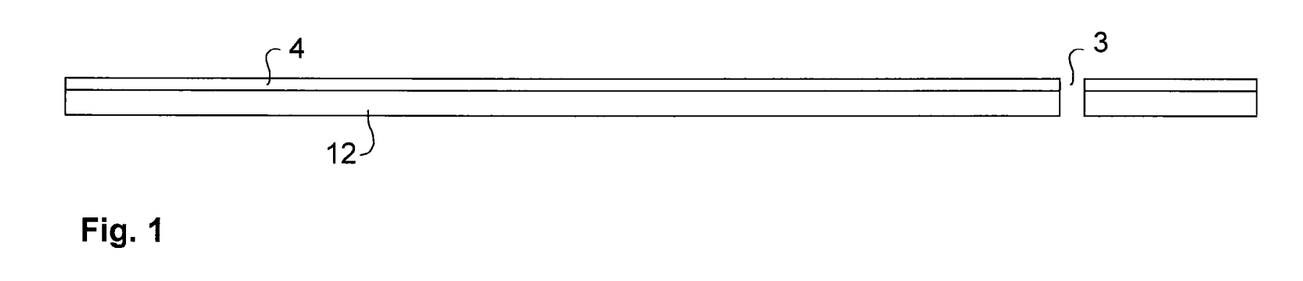
FIGS. 1-10 show a series of cross-sections of some examples of manufacturing methods according to the invention and schematic cross-sectional diagrams of some electronic modules according to the invention.

Stage A (FIG. 1):

In stage A, a suitable conductive layer 4 is selected as the initial material of the process. A layered sheet, in which the conductive layer 4 is located on the surface of a support base 12, can also be selected as the initial material. The layered sheet can be manufactured, for example, in such a way that a suitable support base 12 is taken for processing, and a suitable conductive film for forming the conductive layer 4 is attached to the surface of this support base 12.

The support base 12 can be made of, for example, an electrically conductive material, such as aluminium (Al), or an insulating material, such as polymer. The conductive layer 4 can be formed, for example, by attaching a thin metal film to the second surface of the support base 12, for example, by laminating it from copper (Cu). The metal film can be attached to the support base, for example, using an adhesive layer, which is spread on the surface of the support base 12 or metal film prior to the lamination of the metal layer. At this stage, there need not be any patterns in the metal film.

In the example of FIG. 1, holes 3 are made penetrating the support base 12 and the conductive layer 4, for alignment during the installation and connection of the components 6. Two through-holes 3, for example, can be manufactured for each component 6 to be installed. The holes 3 can be made using some suitable method, for example, mechanically by milling, impact, drilling, or with the aid of a laser. However, it is not essential to make through-holes 3, instead some other suitable alignment markings can be used to align the components. In the embodiment shown in FIG. 1, the through-holes 3 used to align the components extend through both the support base 12 and the conductive film 4. This has the advantage that the same alignment marks (through-holes 3) can be used for aligning on both sides of the installation base.

Stage A can also be performed in the same way in embodiments in which a self-supporting conductive layer 4 is used and from which thus totally lacks a support layer 12.

Figure 2:
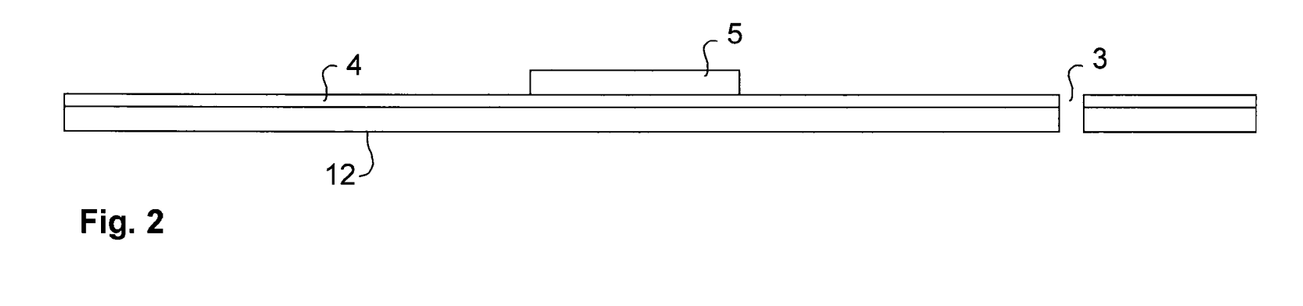

Stage B (FIG. 2):

In stage B, an adhesive layer 5 is spread on those areas of the conductive layer 4, to which the components 6 will be attached. These areas can be termed attachment areas. The adhesive layers 5 can be aligned, for example, with the aid of the through-holes 3. The thickness of the adhesive layer is selected so that the adhesive suitably fills the space between the component 6 and the conductive layer 4, when the component 6 is pressed onto the adhesive layer 5. If the component 6 includes contact protrusions 7, it would be good for the thickness of the adhesive layer 5 to be greater, for example about 1.5-10 times, the height of the contact protrusions 7, so that the space between the component 6 and the conductive layer 4 will be properly filled. The surface area of the adhesive layer 5 formed for the component 6 can also be slightly larger than the corresponding surface area of the component 6, which will also help to avoid the risk of inadequate filling.

Stage B can be modified in such a way that the adhesive layer 5 is spread on the attachment surfaces of the components 6, instead of on the attachment areas of the conductive layer 4. This can be carried out, for example, by dipping the component in adhesive, prior to setting it in place in electronic module. It is also possible to proceed by spreading the adhesive on both the attachment areas of the conductive layer 4 and on the attachment surfaces of the components 6. Such modifications are further described below with reference to FIGS. 12 to 14.

The adhesive being used is thus a electrical insulator, so that electrical contacts are not formed in the actual adhesive layer 5, between the contact zones (contact protrusions 7 in the example) of the component 6.

Figure 3:
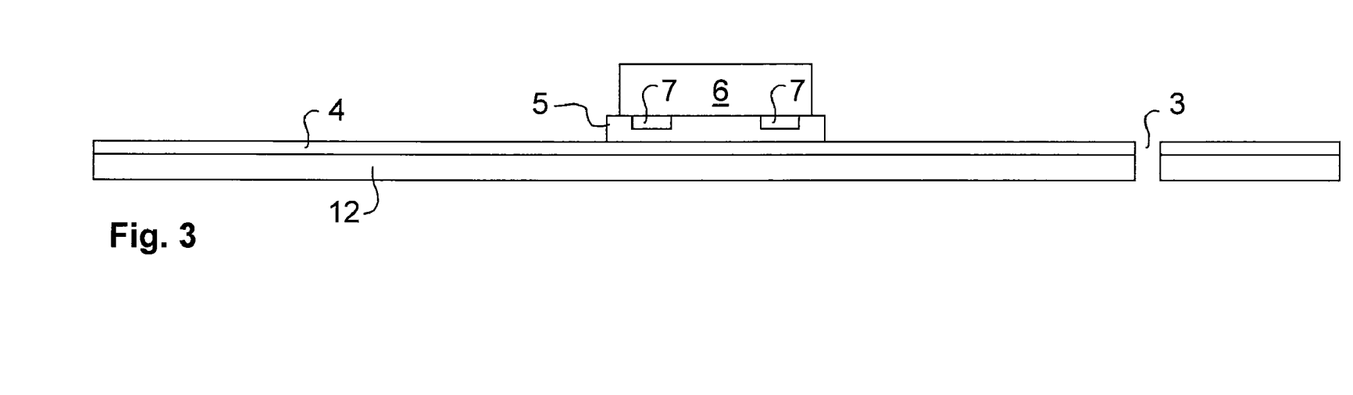

Stage C (FIG. 3):

In stage C, the component 6 is set in place in the electronic module. This can be done, for example, by pressing the components 6 into the adhesive layer 5, with the aid of an assembly machine. In the assembly stage, the through-holes 3 made for alignment, or other available alignment marks, are used to align the components 6.

The components 6 can be glued individually, or in suitable groups. The typical procedure is for the conductive layer, which can be termed the bottom of the installation base, to be brought to a suitable position relative to the assembly machine, and after this the component 6 is aligned and pressed onto the bottom of the installation base, which is held stationary during the aligning and attaching.

Figure 4:
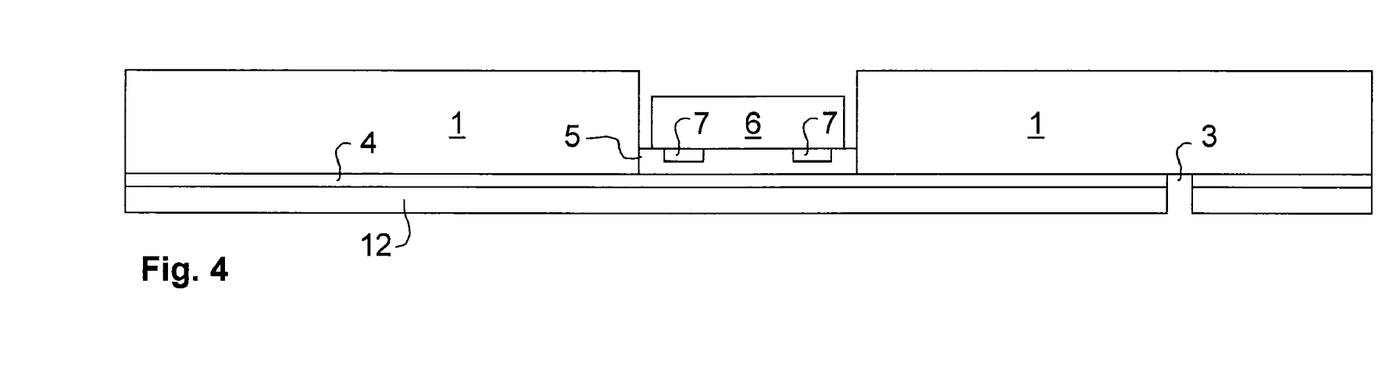

Stage D (FIG. 4):

In stage D, an insulating-material layer 1, in which there are pre-formed recesses 2 or recesses for the components 6 to be glued to the conductive layer 4, is placed on top of the conductive layer 4. The insulating-material layer 1 can be made from a suitable polymer base, in which recesses or cavities according to the size and position of the components 6 are made using some suitable method. The polymer made can be, for example, a pre-preg base known and widely used in the circuit-board industry, which is made from a glass-fibre mat and so-called b-state epoxy. It is best to perform stage D only once the adhesive layer 5 has been hardened, or it has otherwise hardened sufficiently for the components 6 to remain in place during the placing of the insulating-material layer 1.

When manufacturing a very simple electronic module, the insulating-material layer 1 can be attached to the conductive layer 4 in connection with stage D and the process continued with the patterning of the conductive layer 4.

Figure 5:
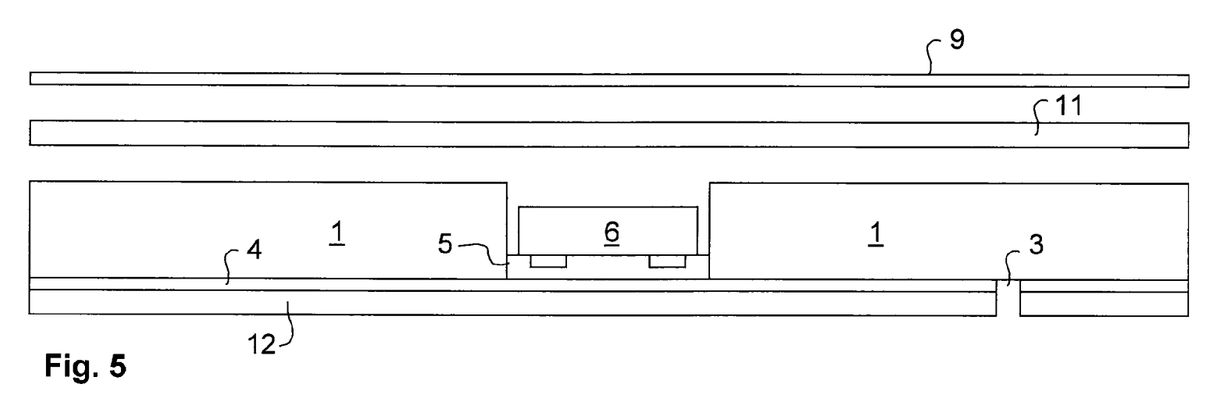

Stage E (FIG. 5):

In stage E, an unpatterned insulating-material layer 11 is placed on top of the insulating-material layer 1 and on top of it a conductive layer 9. Like the insulating-material layer 1, the insulating-material layer 11 can be made from a suitable polymer film, for example, the aforesaid pre-preg base. The conductive layer 9 can, in turn, be, for example, a copper film, or some other film suitable for the purpose.

Figure 6:
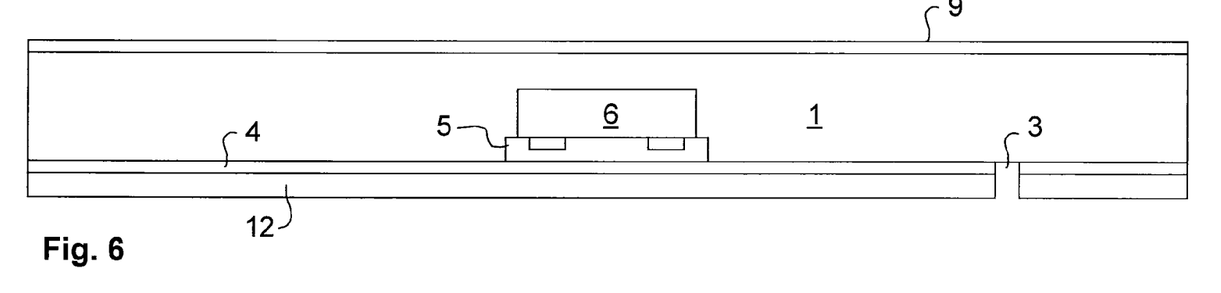

Stage F (FIG. 6):

In stage F, the layers 1, 11, and 9 are pressed with the aid of heat and pressure in such a way that the polymer (in the layers 1 and 11) forms a unified and tight layer between the conductive layer 4 and 9 around the components 6. The use of this procedure makes the second conductive layer 9 quite smooth and even.

When manufacturing simple electronic modules and those including a single conductive-pattern layer 14, stage E can even be totally omitted, or the layers 1 and 11 can be laminated to the construction, without a conductive layer 9.

Figure 7:
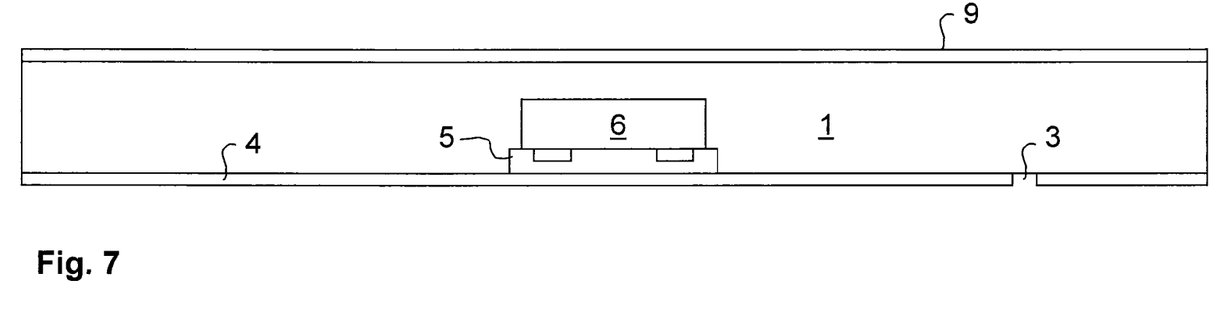

Stage G (FIG. 7):

In stage G, the support base 12 is detached or otherwise removed from the construction. Removal can take place, for example, mechanically or by etching. Stage G can naturally be omitted from embodiments that do not employ a support base 12.

Figure 8:
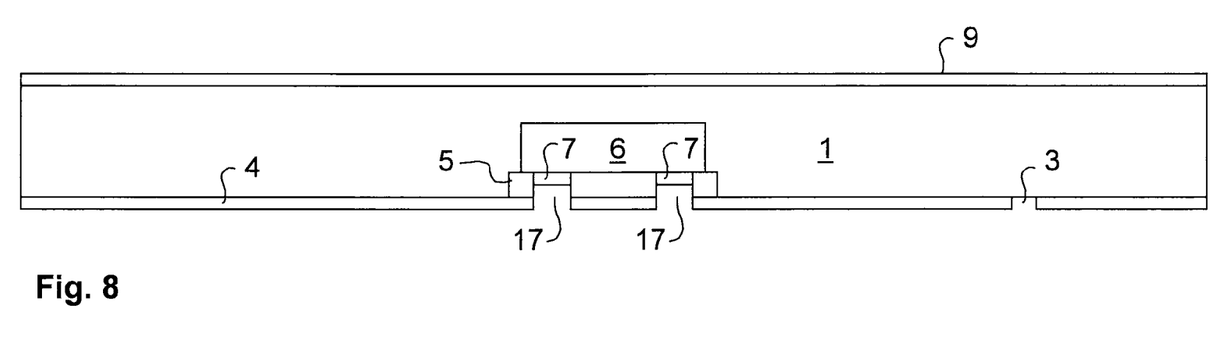

Stage H (FIG. 8):

In stage H, holes 17 are made for the feed-throughs. The holes 17 are made through the conductive layer 4 and the adhesive layer 5, in such a way that the material of the contact protrusions 7, or other contact zones of the components 6 is exposed. The holes 17 can be made, for example, by drilling with a laser. The holes 17 can be aligned, for example, with the aid of holes 3.

Figure 9:
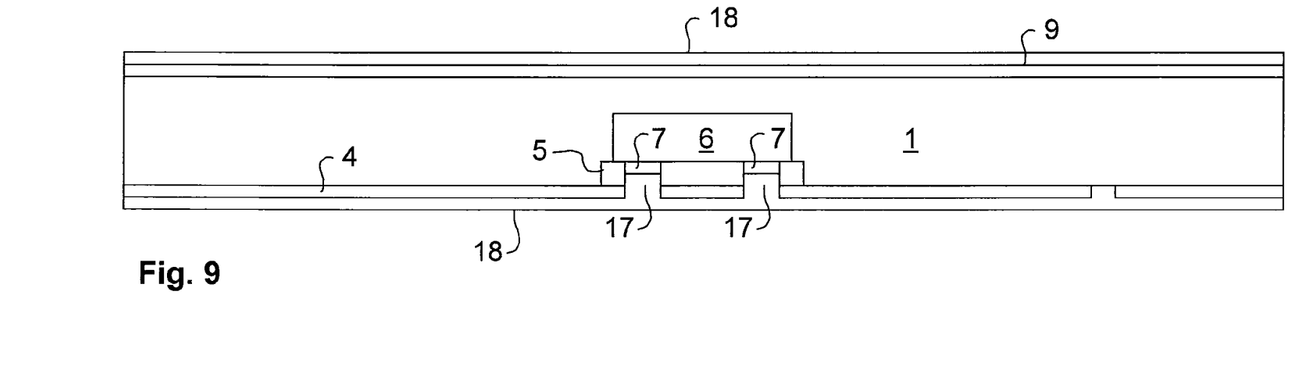

Stage I (FIG. 9):

In stage I, conductive material 18 is grown into the holes 17 made in stage H. In the example process, the conductive material is grown at the same time also elsewhere on top of the base, so that the thickness of the conductive layers 4 and 9 also increases.

The conductive material 18 being grown can be, for example, copper, or some other sufficiently electrically conductive material. The choice of conductive material 18 should take into account the ability of the material to form an electrical contact with the contact protrusions 7 of the component 6. In one example process, the conductive material is mainly copper. Copper-metallizing can be performed by surfacing the holes 17 with a thin layer of chemical copper and then continuing the surfacing using an electrochemical copper-growing method. Chemical copper is used, for example, because it also forms a surface on top of the adhesive and acts as an electrical conductor in electrochemical surfacing. The growth of the metal can thus be performed using a wet-chemical method, in which case the growing will be cheap.

In the example process, the holes 17 of the feed-throughs are first cleaned using a three-stage desmear treatment. After this, the feed-throughs are metallized in such a way that an SnPd coating catalysing the polymer is first formed, after which a thin layer (about 2 μm) is deposited on the surface. The thickness of the copper is increased using electrochemical deposition.

Stage I is intended to form an electrical contact between the component 6 and the conductive layer 4. In stage I, it is therefore not essential to increase the thickness of the conductive layers 4 and 9, instead the process can equally well be planned in such a way that in stage I the holes 17 are only filled with a suitable material. The conductive layer 18 can be made, for example, by filling the holes 17 with an electrically conductive paste, or by using some other metallizing method suitable for micro-vias.

In the later figures, the conductive layer 18 is shown with the conductive layers 4 and 9 merged.

Figure 10:
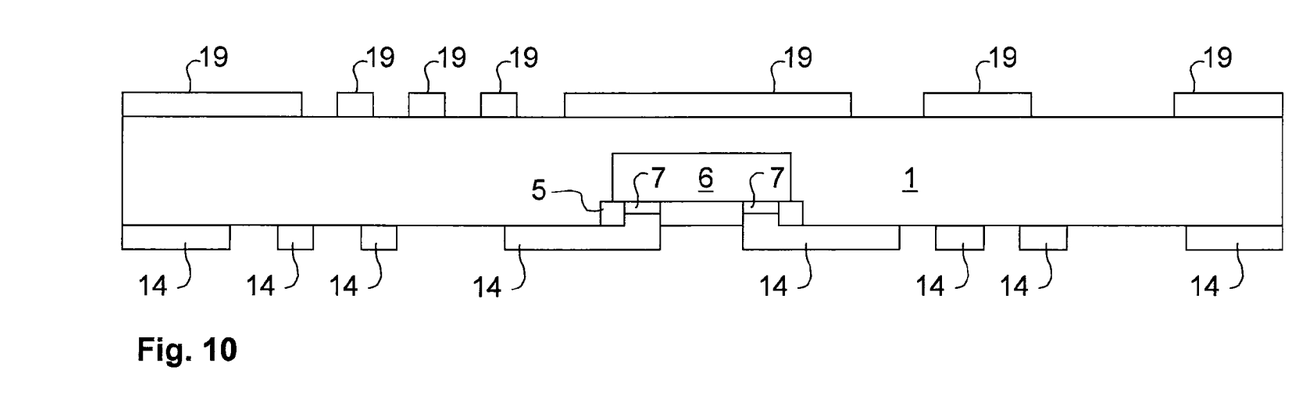

Stage J (FIG. 10):

In stage J, the desired conductive patterns 14 and 19 are formed from the conductive layers 4 and 9 on the surface of the base. If only a single conductive layer 4 is used in the embodiment, the patterns are formed on only one side of the base. It is also possible to proceed in such a way that the conductive patterns are only formed from the conductive layer 4, even though a second layer 9 is also used in the embodiment. In such an embodiment, the unpatterned conductive layer 9 can act, for example, as a mechanically supporting or protective layer of the electronic module, or as a protection against electromagnetic radiation.

The conductive patterns 14 can be made, for instance, by removing the conductive material of the conductive layer 4 from outside of the conductive patterns. The conductive material can be removed, for example, using one of the patterning and etching methods that are widely used and well known in the circuit-board industry.

After stage J, the electronic module includes a component 6, or several components 6 and conductive patterns 14 and 19 (in some embodiments only conductive patterns 14), with the aid of which the component or components 6 can be connected to an external circuit, or to each other. The conditions for manufacturing a functional totality then exist already. The process can thus be designed in such a way that the electronic module is already finished after stage J and FIG. 10 shows one example of a possible electronic module that can be manufactured using the example methods. If it is wished, the process can also continue after stage J, for example, by surfacing the electronic module with a protective substance, or by making additional conductive patterns on the first and/or second surface of the electronic module.

Figure 11:
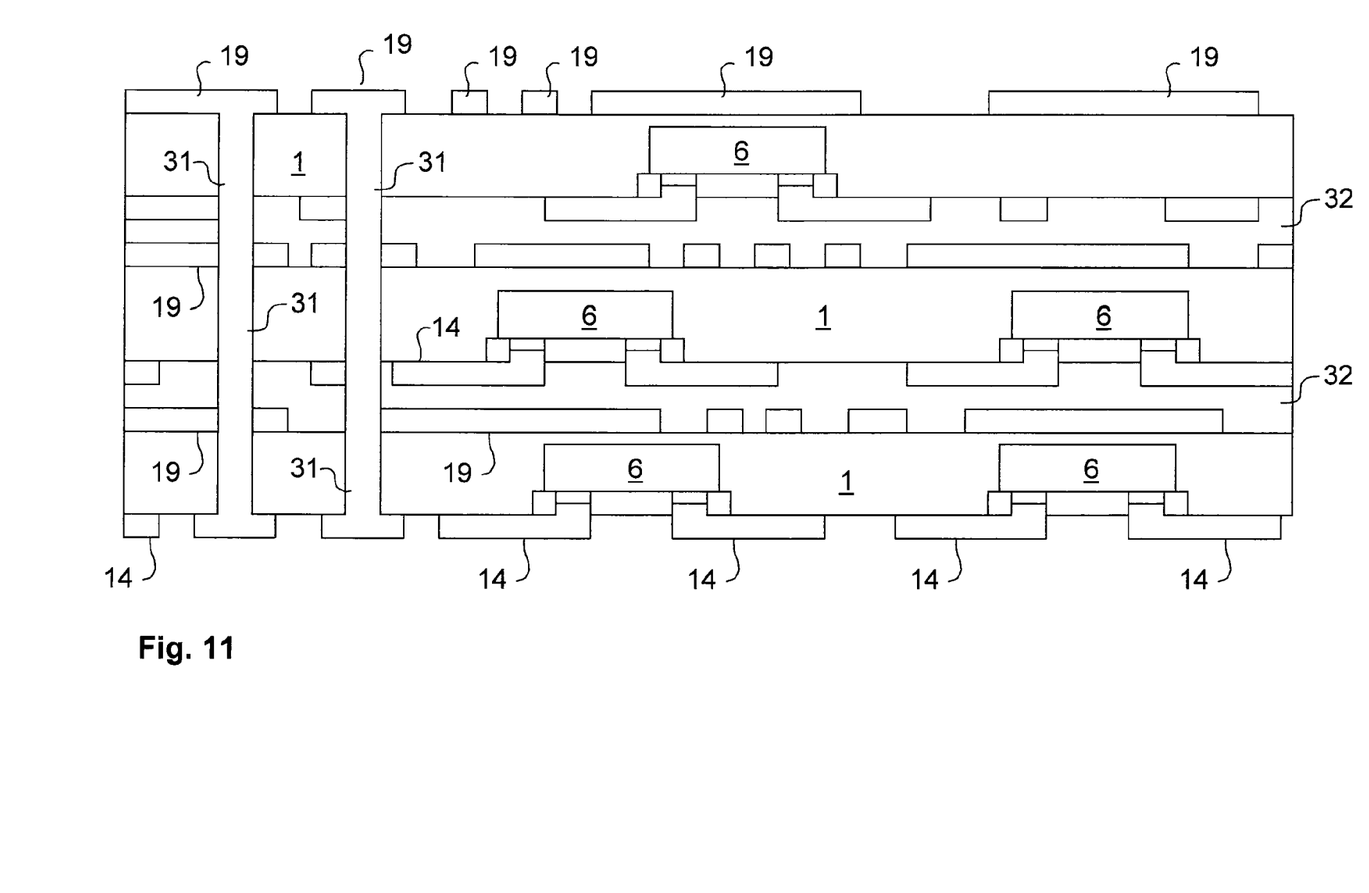
FIG. 11 shows a cross-sectional view of one electronic module according to the invention, which includes several installation bases on top of each other.

FIG. 11

FIG. 11 shows a multi-layered electronic module, which includes three bases 1 laminated on top of each other, together with their components 6, and a total of six conductive-pattern layers 14 and 19. The bases 1 are attached to each other with the aid of intermediate layers 32. The intermediate layer 32 can be, for example, a pre-preg epoxy layer, which is laminated between the installation bases 1. After this, holes running through the module are drilled in the electronic module, in order to form contacts. The contacts are formed with the aid of a conductive layer 31 grown in the holes. With the aid of the conducts 31 running through the electronic module, the various conductive-pattern layers 14 and 19 of the installation bases 1 can be suitably connected to each other, thus forming a multi-layered functioning totality.

On the basis of the example of FIG. 11, it is clear that the method can also be used to manufacture many different kinds of three-dimensional circuit structures. The method can be used, for example, in such a way that several memory circuits are placed on top of each other, thus forming a package containing several memory circuits, in which the memory circuits are connected to each other to form a single functional totality. Such packages can be termed three-dimensional multichip modules. In modules of this kind, the chips can be selected freely and the contacts between the various chips can be easily manufactured according to the selected circuits.

The sub-modules (bases 1 with their components 6 and conductors 14 and 19) of a multi-layered electronic module can be manufactured, for example, using one of the electronic-module manufacturing methods described above. Some of the sub-modules to be connection to the layered construction can, of course, be quite as easily manufactured using some other method suitable for the purpose.

Figures 12, 13:
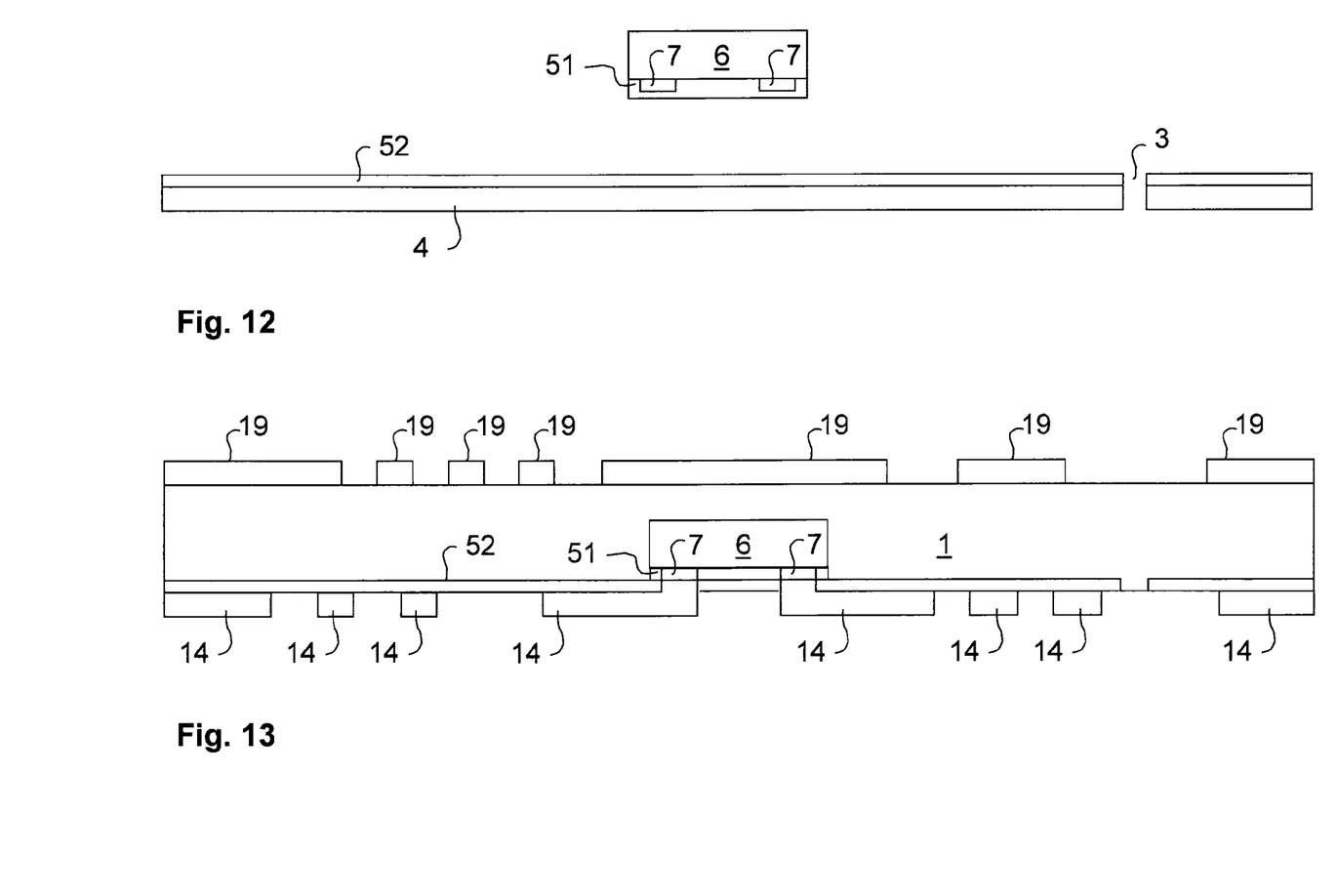
FIG. 12 shows two adhesive layers according to an embodiment.
FIG. 13 shows a cross-section of a module with two-layer adhesive according to an embodiment.
Figure 14:
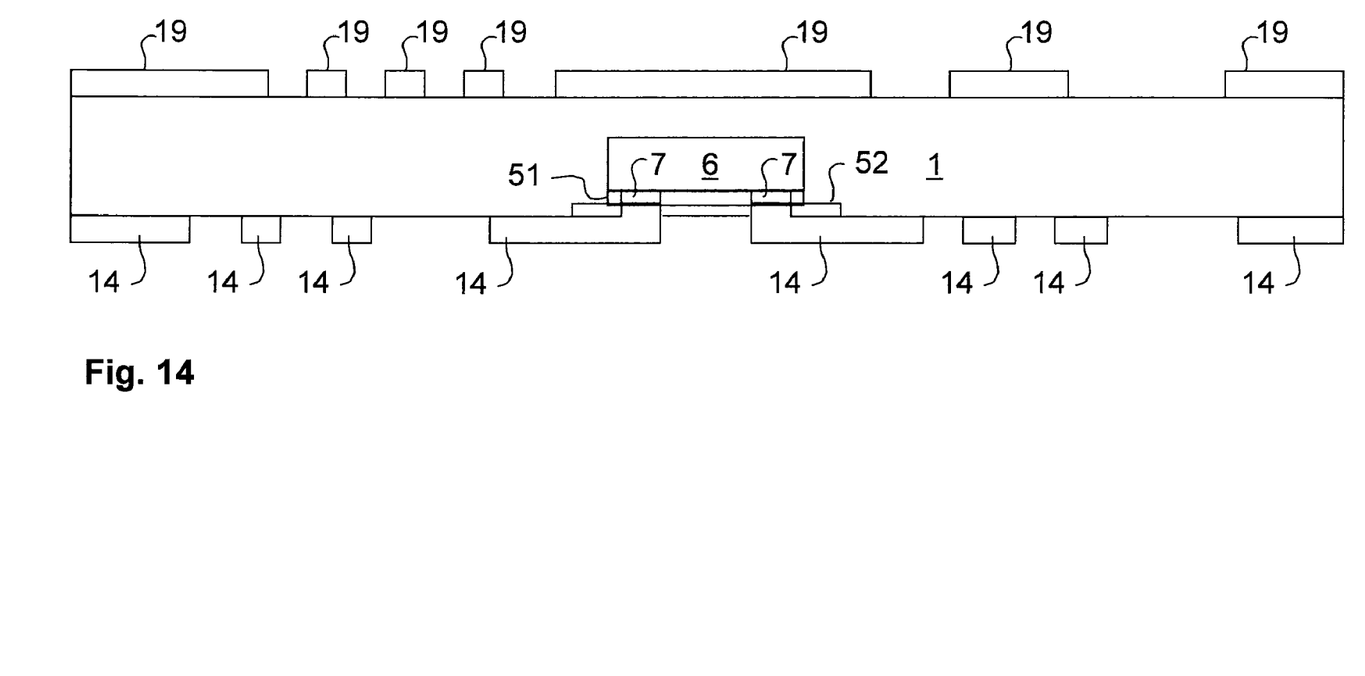
FIG. 14 shows a cross-section of a module with two-layer adhesive according to another embodiment.

FIGS. 12 to 14 show embodiments wherein the adhesive 5 is divided into two different layers, a first adhesive layer 51 and a second adhesive layer 52. According to FIG. 12, the first adhesive layer 51 is applied on the surface of the component 6 and the second adhesive layer 52 is applied on the surface of the conductor layer 4. After this, the process is continued for example as described above, and the resultant electronic module is shown in FIG. 13. In the embodiment of FIG. 12, the second adhesive layer 52 covers the whole surface of the conductor layer 4, and therefore also the surface of all the conductors 14 in the resultant module of FIG. 13. FIG. 14 shows an electronic module, wherein the second adhesive layer 52 is local. The thickness of the first adhesive layer 51 can be for example 10-30 micrometers, such as 15-20 micrometers. The thickness of the second adhesive layer 51 can be for example 5-20 micrometers, such as 10-15 micrometers. Of course, other thicknesses can also be used when appropriate.

The examples of FIGS. 1-14 show some possible processes, with the aid of which our invention can be exploited. Our invention is not, however, restricted to only the processes disclosed above, but instead the invention also encompasses various other processes and their end products, taking into account the full scope of the Claims and the interpretation of their equivalences. The invention is also not restricted to only the constructions and method described by the examples, it being instead obvious to one versed in the art that various applications of our invention can be used to manufacture a wide range of different electronic modules and circuit boards, which differ greatly from the examples described above. Thus, the components and wiring of the figures are shown only with the intention of illustrating the manufacturing process. Thus many alterations to and deviations from the processes of the examples shown above can be made, while nevertheless remaining within the basic idea according to the invention. The alterations can relate, for example, to the manufacturing techniques described in the different stages, or to the mutual sequence of the process stages.

With the aid of the method, it is also possible to manufacture component packages for connection to a circuit board. Such packages can also include several components that are connected electrically to each other.

The method can also be used to manufacture total electrical modules. The module can also be a circuit board, to the outer surface of which components can be attached, in the same way as to a conventional circuit board.

The invention claimed is:

1. An electronic module, comprising:
a conductive-pattern layer;
an insulating-material layer supporting the conductive-pattern layer;
at least one component inside the insulating-material layer, the at least one component comprising a first surface and contact zones on the first surface;
a first hardened adhesive layer on the first surface of the at least one component;
a second hardened adhesive layer in contact with the conductive-pattern layer and the first hardened adhesive layer;
holes in the first and second hardened adhesive layer at the locations of the contact zones; and
conductive material in the holes and in electrical connection with the contact zones of the component and the conductive-pattern layer,
wherein the first hardened adhesive layer has a first composition and the second hardened adhesive layer has a second composition different from the first composition.

2. The electronic module of claim 1, wherein the second hardened adhesive layer covers the conductive-pattern layer such that the insulating-material layer supports the conductive-pattern layer via said second hardened adhesive layer.

3. The electronic module of claim 1, wherein the first and second hardened adhesive layers are local and present at the location of the component such that the insulating-material layer directly supports the conductive-pattern layer.

4. An electronic module, comprising:
- at least one semiconductor component comprising a first surface and a set of contact zones on the first surface;
- a first hardened adhesive layer on the first surface;
- a second hardened adhesive layer at least on the first hardened adhesive layer;
- contact elements made of metal on the set of contact zones, the contact elements extending through the first and second hardened adhesive layers;
- conductors in contact with the contact elements and forming a conductive-pattern layer; and
- an insulating-material layer around the at least one semiconductor component,
- wherein the first hardened adhesive layer has a first composition and the second hardened adhesive layer has a second composition different from the first composition.

5. The electronic module of claim 4, wherein the at least one semiconductor component comprises at least one microcircuit.

6. The electronic module of claim 4, wherein the area of the first hardened adhesive layer is equal to the area of the first surface of the at least one semiconductor component.

7. The electronic module of claim 4, wherein the area of the first hardened adhesive layer is greater than the area of the second hardened adhesive layer.

8. The electronic module of claim 4, wherein the contact elements comprise a first layer of metal and at least one second layer of metal.

9. The electronic module of claim 4, wherein the contact elements are in metallurgical contact with the respective contact zones and the respective conductors.

* * * * *